(12) United States Patent
Chen et al.

(10) Patent No.: US 10,135,431 B2
(45) Date of Patent: Nov. 20, 2018

(54) FAST-RESPONSE REFERENCE-LESS FREQUENCY DETECTOR

(71) Applicant: Integrated Device Technology, Inc., San Jose, CA (US)

(72) Inventors: Xinqing Chen, Shanghai (CN); HaiQi Liu, Shanghai (CN); Yuan Zhang, Shanghai (CN)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/468,352

(22) Filed: Mar. 24, 2017

(65) Prior Publication Data

US 2018/0212598 A1 Jul. 26, 2018

(30) Foreign Application Priority Data

Jan. 26, 2017 (CN) .......................... 2017 1 0056867

(51) Int. Cl.
- *G01R 23/02* (2006.01)
- *H03K 5/19* (2006.01)
- *H03K 19/21* (2006.01)

(52) U.S. Cl.
CPC ............... *H03K 5/19* (2013.01); *H03K 19/21* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,279,995 B2 * | 10/2007 | Kernahan | .......... | H03K 19/0963 331/177 R |
| 7,646,224 B2 * | 1/2010 | Sundby | .................... | H03K 5/19 327/147 |
| 8,699,627 B2 * | 4/2014 | Crepaldi | .............. | H04B 1/7183 375/316 |

* cited by examiner

*Primary Examiner* — An Luu
(74) *Attorney, Agent, or Firm* — Christopher P. Maiorana, PC

(57) ABSTRACT

An apparatus comprising a first circuit and a second circuit. The first circuit may be configured to generate an intermediate signal in response to an input clock signal operating at a frequency. The first circuit may modify the input clock signal according to a threshold frequency to generate a waveform for the intermediate signal. The waveform of the intermediate signal may have at least one of (i) pulses and (ii) a steady state. The second circuit may be configured to generate a control signal in response to the intermediate signal. The second circuit may modify the intermediate signal to generate the control signal. The control signal may have a first state when the intermediate signal has pulses. The control signal may have a second state when the intermediate signal has the steady state.

19 Claims, 9 Drawing Sheets

FAST-RESPONSE REFERENCE-LESS FREQUENCY DETECTOR

This application relates to Chinese Application No. 201710056867.2, filed Jan. 26, 2017, which is hereby incorporated by reference in its entirety.

FIELD OF THE INVENTION

The invention relates to clock circuits generally and, more particularly, to a method and/or apparatus for implementing a fast-response reference-less frequency detector.

BACKGROUND

A conventional frequency detector compares the frequency of an input clock with the frequency of a reference clock to determine whether the input clock is faster or slower than the reference clock. One implementation uses two separate counters to count edges of the input clock and edges of the reference clock. Values stored in those counters are then compared after a certain number of reference cycles. Comparison is slow with such an implementation. Certain applications, such as those in a memory interface, do not have a reference clock available. Fast detection compared with a frequency threshold is also needed in certain applications.

It would be desirable to implement a fast-response reference-less frequency detector.

SUMMARY

The invention concerns an apparatus comprising a first circuit and a second circuit. The first circuit may be configured to generate an intermediate signal in response to an input clock signal operating at a frequency. The first circuit may modify the input clock signal according to a threshold frequency to generate a waveform for the intermediate signal. The waveform of the intermediate signal may have at least one of (i) pulses and (ii) a steady state. The second circuit may be configured to generate a control signal in response to the intermediate signal. The second circuit may modify the intermediate signal to generate the control signal. The control signal may have a first state when the intermediate signal has pulses. The control signal may have a second state when the intermediate signal has the steady state.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a detector that may (i) be implemented without a clock reference, (ii) provide a fast-response, (iii) provide a reference-less, analog type frequency, (iv) comprise two pulse-shaping circuits in series to implement the function of frequency detection, (v) implement a frequency detector without an external reference clock that may be used in applications when an external reference clock is not available, (vi) produce a result within one cycle and/or (vii) be implemented as one or more integrated circuits.

Figure 1:
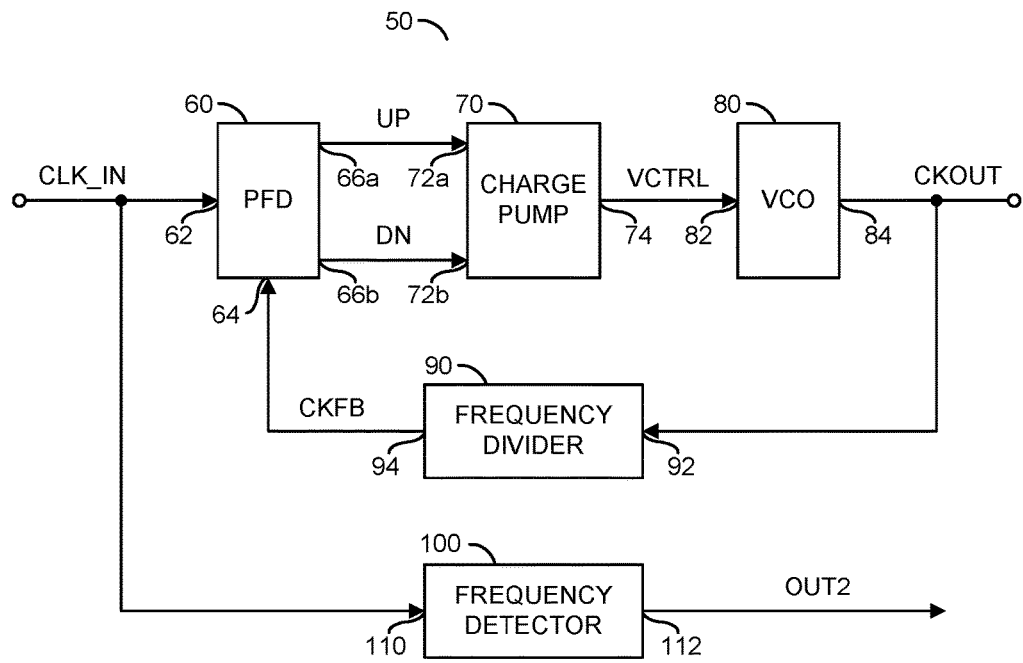
FIG. 1 is a block diagram of a clock generation circuit.

Referring to FIG. 1, a block diagram of a circuit 50 is shown in accordance with an embodiment of the invention. The circuit 50 generally comprises a block (or circuit) 60, a block (or circuit) 70, a block (or circuit) 80, a block (or circuit) 90 and/or a block (or circuit) 100. The circuit 60 may implement phase frequency detector (PFD). The circuit 70 may implement a charge pump circuit. The circuit 80 may implement a voltage controlled oscillator (VCO) circuit. The circuit 90 may implement a frequency divider. The circuit 100 may implement a fast-response reference-less frequency detector.

The circuit 100 may have an input 110 that may receive a signal (e.g., CLK_IN). The signal CLK_IN may be an input clock signal. For example, the signal CLK_IN may be an input to the circuit 50. The signal CLK_IN may operate (e.g., oscillate) at a frequency (e.g., $f_{in}$). The circuit 100 may have an output 112 that may present a signal (e.g., OUT2). The signal OUT2 may be an output of the circuit 50. The signal OUT2 may represent a comparison of the frequency $f_{in}$ of the input clock signal CLK_IN and a pre-determined threshold frequency (e.g., $f_{th}$)

The circuit 60 may have an input 62 that may receive the signal CLK_IN, and an input 64 that may receive a signal (e.g., CKFB). The circuit 60 may have an output 66a that may present a signal (e.g., UP) and an output 66b that may present a signal (e.g., DN). The circuit 70 may have an input 72a that may receive the signal UP and an input 72b that may receive the signal DN. The circuit 70 may have an output that may present a signal (e.g., VCTRL). The signal VCTRL may be a voltage control signal. The circuit 80 may have an input 82 that may receive the signal VCTRL. The circuit 80 may have an output 84 that may present a signal (e.g., CKOUT). The signal CKOUT may be an output of the circuit 50. The circuit 90 may have an input 92 that may receive the signal CKOUT. The circuit 90 may have an output 94 that may present a signal (e.g., CKFB). The signal CKFB may be received by the input 64 of the circuit 60.

The circuit 60 may generate the signal UP and/or the signal DN in response to the input clock signal CLK_IN and/or the feedback signal CKFB presented by the frequency divider 90. For example, the signal UP and/or the signal DN may be generated by the circuit 60 in response to a comparison between the signal CLK_IN and the feedback signal CKFB. The PFD 60 may generate the signal UP when the frequency of the feedback signal CKFB from the circuit 90 is lower than the frequency of the input clock signal CLK_IN. The PFD 60 may generate the signal DN when the frequency of the feedback signal CKFB from the circuit 90 is higher than the frequency of the input clock signal CLK_IN.

Figure 2:
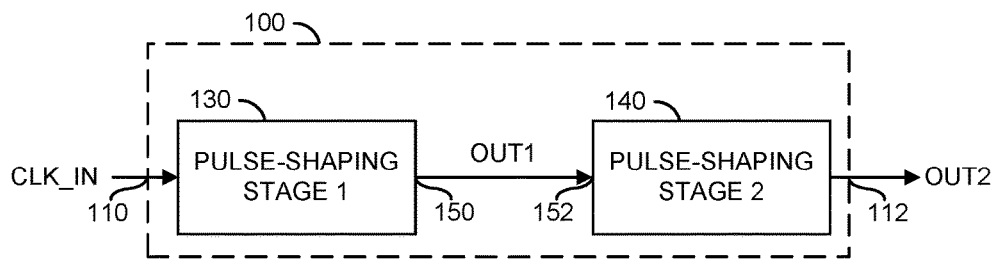
FIG. 2 is a block diagram of an embodiment of the invention.

Referring to FIG. 2, a block diagram of the circuit 100 is shown. The circuit 100 may be implemented as a frequency detector. The circuit 100 may receive the signal CLK_IN. The circuit 100 may not receive a reference clock signal (e.g., a reference clock signal may not be available). The circuit 100 may present the signal OUT2. The signal OUT2 may implement a control signal. The circuit 100 may be configured to detect a frequency range of a phase-locked loop (PLL) input clock signal.

The circuit 100 generally comprises a block (or circuit) 130 and a block (or circuit) 140. The block 130 may be implemented as a first pulse-shaping circuit (or a stage 1 circuit). The circuit 140 may be implemented as a pulse-shaping circuit (or stage 2 circuit). The pulse-shaping circuit 130 and the pulse-shaping circuit 140 may be implemented in series. The circuit 100 may comprise other components and/or connections (not shown). The number and/or type of components and/or connections implemented by the circuit 100 may be varied according to the design criteria of a particular implementation.

The circuit 130 may receive the input clock signal CLK_IN at the input 110 of the circuit 100. The circuit 130 may have an output 150 that may present a signal OUT1. The signal OUT1 may be an intermediate signal. The intermediate signal OUT1 may be generated by the circuit 130 in response to the input clock signal CLK_IN. The input clock signal CLK_IN may operate at the frequency $f_{in}$. The intermediate signal OUT1 may have a waveform shape based on the frequency $f_{in}$ of the input clock signal CLK_IN. For example, the circuit 130 may modify the input signal CLK_IN according to the pre-determined threshold frequency $f_{th}$ to generate the waveform of the intermediate signal OUT1.

The circuit 140 may have an input 152. The input 152 may receive the intermediate signal OUT1. The circuit 140 may generate the signal OUT2. The signal OUT2 may be presented at the output 112 of the circuit 100. The signal OUT2 may be a control signal.

The pulse-shaping circuit 130 and the pulse-shaping circuit 140 may be used to determine whether the frequency $f_{in}$ of the input clock signal CLK_IN is higher or lower than the pre-determined threshold frequency $f_{th}$. The control signal OUT2 may become high or low depending on a shape of the waveform of the intermediate signal OUT1. The shape of the waveform of the intermediate signal OUT1 and/or the control signal OUT2 may be based on whether the frequency $f_{in}$ of the signal CLK_IN is higher or lower than the frequency $f_{th}$. The control signal OUT2 may be configured to represent a comparison of the frequency $f_{in}$ of the input clock signal CLK_IN and the pre-determined threshold frequency $f_{th}$.

The first stage pulse-shaping circuit 130 may be configured to modify (or process) the waveform of the input clock signal CLK_IN. In an example, the input clock signal CLK_IN may be modified according to the threshold frequency $f_{th}$. The modifying performed by the first stage pulse-shaping circuit 130 on the input clock signal CLK_IN may generate the intermediate signal OUT1. The modifying performed by the first stage pulse-shaping circuit 130 may generate the intermediate signal OUT1 having a particular shape (or waveform). The shape and/or characteristics of the waveform of the intermediate signal OUT1 may be varied according to the design criteria of a particular implementation.

The circuit 130 may generate a series of pulses on the intermediate signal OUT1. In some embodiments, the intermediate signal OUT1 may have a shape (or waveform) that has pulses. The width of the pulses may be based on the threshold frequency. In one example, the width of the pulses may be $0.5/f_{th}$. The pulses may correspond to a rising edge and/or a falling edge of the input clock signal CLK_IN. The intermediate signal OUT1 may have a waveform shape with the pulses when the frequency $f_{in}$ of the input clock signal CLK_IN is higher than the threshold frequency $f_{th}$. In one example, the pulses of the intermediate signal OUT1 may be negative pulses.

The circuit 130 may generate a steady state on the intermediate signal OUT1. In some embodiments, the intermediate signal OUT1 may have a shape (or waveform) that has a steady state and/or a constant voltage. In one example, the intermediate signal OUT1 may have a constant high (e.g., logical high) voltage. In another example, the intermediate signal OUT1 may have a constant low (e.g., logical low) voltage. The intermediate signal OUT1 may have a waveform shape with the steady (e.g., constant) state when the frequency $f_{in}$ of the input clock signal CLK_IN is lower than the threshold frequency $f_{th}$.

The second stage pulse-shaping circuit 140 may modify (or process) the intermediate signal OUT1. In an example, the intermediate signal OUT1 may be modified according to the threshold frequency $f_{th}$. The modifying performed by the second stage pulse-shaping circuit 140 on the intermediate signal OUT1 may generate the control signal OUT2. The modifying performed by the second stage pulse-shaping circuit 140 may generate the control signal OUT2 having a particular shape (or waveform). The shape and/or characteristics of the waveform of the control signal OUT2 may be varied according to the design criteria of a particular implementation.

The control signal OUT2 may represent a comparison between the frequency $f_{in}$ and the threshold frequency $f_{th}$. The control signal OUT2 may have a steady-state and/or constant waveform shape. The control signal OUT2 may be generated with one state when the intermediate signal OUT1 has the pulses and another state when the intermediate signal OUT1 has the steady state. In one example, the control signal OUT2 may be a logical high voltage when there are negative pulses on the intermediate signal OUT1 (e.g., $f_{in}<f_{th}$). In another example, the control signal OUT2 may be a logical low voltage when the intermediate signal OUT1 is a constant logical low voltage (e.g., $f_{in}>f_{th}$). When the intermediate signal OUT1 has a waveform with pulses, the second stage pulse-shaping circuit 140 may process the pulses to remove the pulses (e.g., generate a constant and/or steady-state waveform). For example, the second stage pulse-shaping circuit 140 may remove the negative pulses on OUT1.

Figure 3:
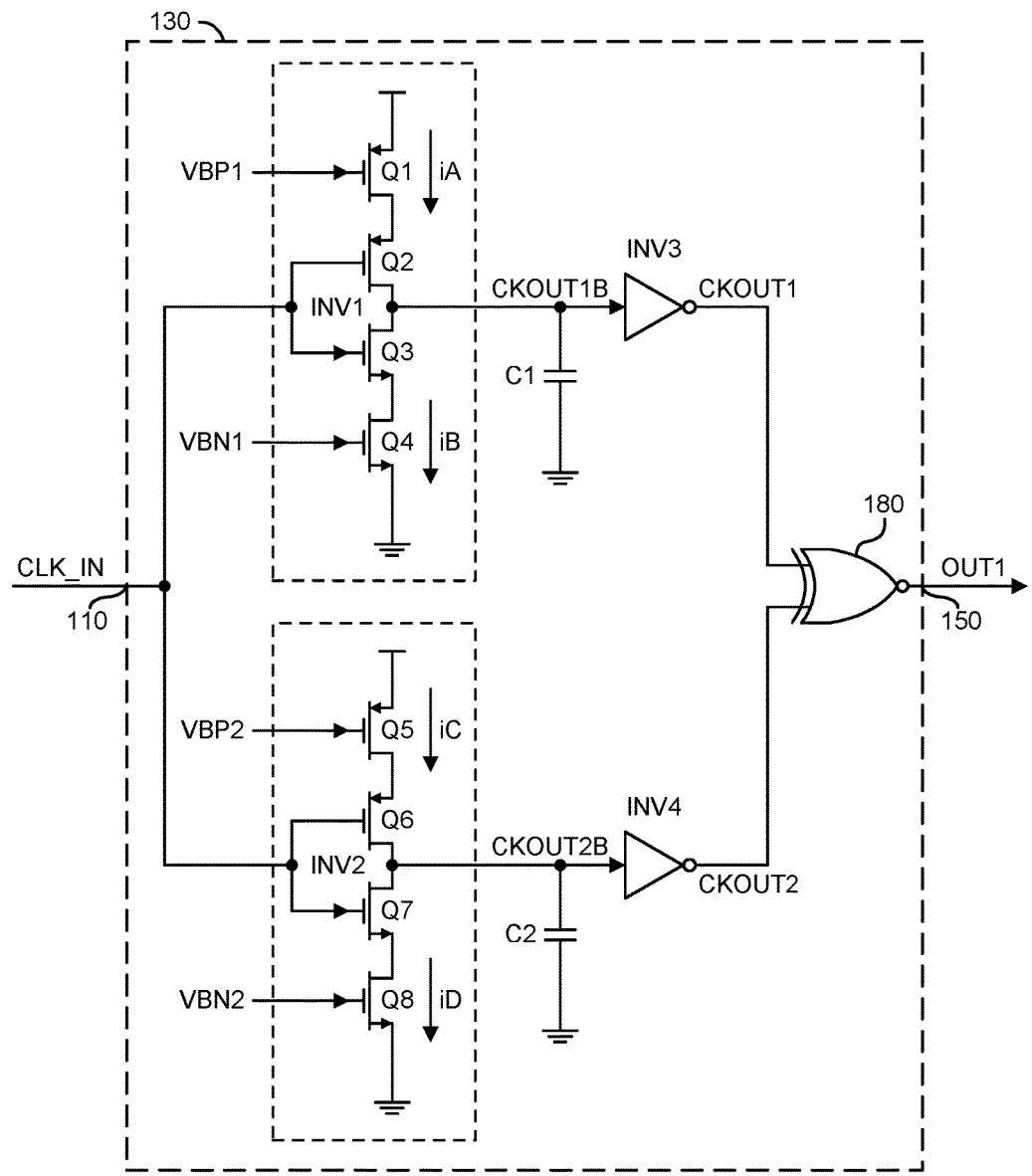
FIG. 3 is a circuit diagram of a pulse-shaping circuit.

Referring to FIG. 3, a circuit diagram of an example implementation of the pulse-shaping circuit 130 is shown. The circuit 130 generally comprises an inverter INV1, an inverter INV2, an inverter INV3 and an inverter INV4. The inverter INV1 and the inverter INV2 may be implemented with an asymmetrical charge/discharge current bias. The inverter INV3 and the inverter INV4 may be implemented as standard (e.g., conventional) inverters.

The inverter INV1 generally comprises a transistor Q1, a transistor Q2, a transistor Q3 and a transistor Q4. In one example, the transistor Q1 and the transistor Q2 may be implemented as PMOS transistors. In one example, the transistor Q3 and the transistor Q4 may be implemented as NMOS transistors. The particular type of transistor implemented may be varied according to the design criteria of a particular implementation. The transistor Q1 may receive a bias signal (e.g., VBP1). The transistor Q4 may receive a bias signal (e.g., VBN1). The transistor Q2 and the transistor Q3 may receive the input clock signal CLK_IN.

The inverter INV2 may be implemented with a transistor Q5, a transistor Q6, a transistor Q7 and a transistor Q8. In one example, the transistor Q5 and the transistor Q6 may be implemented as PMOS transistors. In one example, the transistor Q7 and the transistor Q8 may be implemented as NMOS transistors. The particular type of transistor implemented may be varied according to the design criteria of a particular implementation. The transistor Q5 may receive a bias signal (e.g., VBP2). The transistor Q8 may receive a bias signal (e.g., VBN2). The transistor Q6 and the transistor Q7 may receive the input clock signal CLK_IN. In some embodiments, the bias signal VBP1 and the bias signal VBP2 may be the same signal and/or have the same value. In some embodiments, characteristics and/or a source of the bias signal VBN1 and the bias signal VBN2 may be the same signal and/or have the same value. The implementation of the bias signal VBP1, the bias signal VBP2, the bias signal VBN1 and/or the bias signal VBN2 may be varied according to the design criteria of a particular implementation.

The inverter INV1 may generate an edge-delayed signal (e.g., CKOUT1B). The signal CKOUT1B may be implemented as a sub-signal. In one example, the edge-delayed signal CKOUT1B may be an inverted version of the input clock signal CLK_IN having a delayed falling edge. The delayed falling edge of the input clock signal CLK_IN may be converted to have a rising slope in the signal CKOUT1B. The inverter INV2 may generate an edge-delayed signal (e.g., CKOUT2B). The signal CKOUT2B may be implemented as a sub-signal. In one example, the edge-delayed signal CKOUT2B may be an inverted version of the input clock signal CLK_IN having a delayed rising edge. The delayed rising edge of the input clock signal CLK_IN may be converted to have a falling slope in the signal CKOUT2B.

The edge-delayed signal CKOUT1B may be presented to an input of the inverter INV3. The edge-delayed signal CKOUT2B may be presented to an input of the inverter INV4. A capacitor (e.g., C1) may provide a filter to the input of the inverter INV3 (e.g., filter the signal CKOUT1B). A capacitor (e.g., C2) may provide a filter to the input of the inverter INV4 (e.g., filter the signal CKOUT2B).

The inverter INV3 may generate a signal (e.g., CKOUT1) in response to the signal CKOUT1B. The inverter INV4 may generate a signal (e.g., CKOUT2) in response to the signal CKOUT2B. The inverter INV3 may convert the rising slope of the signal CKOUT1B to a falling edge. The conversion of the rising slope (e.g., the midpoint and/or threshold of the slope where the inverter INV3 inverts the signal) of the signal CKOUT1B may result in a delay of the falling edge of the input clock signal CLK_IN. In one example, the signal CKOUT1 may be a version (e.g., a replica) of the input clock signal CLK_IN with a delayed falling edge. The inverter INV4 may convert the falling slope of the signal CKOUT2B to a rising edge. The conversion of the falling slope (e.g., the midpoint or threshold of the slope where the inverter INV4 inverts the signal) of the signal CKOUT2B may result in a delay of the rising edge of the input clock signal CLK_IN. In one example, the signal CKOUT2 may be a version (e.g., a replica) of the input clock signal CLK_IN with a delayed rising edge.

A gate 180 may be implemented. The gate 180 may be a logic gate configured to combine the sub-signal CKOUT1 and the sub-signal CKOUT2. The gate 180 may be configured to implement an XOR operation. In one example, the gate 180 may be an XOR gate. In some embodiments, the XOR gate 180 may be inverted (e.g., an XNOR gate). The gate 180 may generate the signal OUT1 in response to the signal CKOUT1 and the signal CKOUT2. The signal CKOUT1 and the signal CKOUT2 may be presented to the gate 180 from the inverter INV3 and the inverter INV4, respectively.

In some embodiments, where the frequency $f_{in}$ of the input clock signal CLK_IN is less than the threshold frequency $f_{th}$, the XOR operation of the gate 180 may result in pulses on the waveform of the intermediate signal OUT1. In some embodiments, where the frequency $f_{in}$ of the input clock signal CLK_IN is greater than the threshold frequency $f_{th}$, the XOR operation of the gate 180 may result in a constant waveform of the intermediate signal OUT1. For example, when the frequency $f_{in}$ of the input clock signal CLK_IN is greater than the threshold frequency $f_{th}$, the falling slope and/or the rising slope of the signal CKOUT1B and/or the signal CKOUT2B may not cross the threshold of the inverter INV3 and/or the inverter INV4. If the rising slope and/or the falling slope does not cross the threshold of the inverter INV3 and/or the inverter INV4, the signal CKOUT1 and/or the signal CKOUT2 may have a constant (or steady state) value. When the signal CKOUT1 and/or the signal CKOUT2 have a steady state value, the XOR operation by the gate 180 may result in the intermediate signal OUT1 having a constant value.

The inverter INV1 generally implements a current bias iA and a current bias iB. The inverter INV2 generally implements a current bias iC and a current bias iD. The bias current iA, may be implemented, in one example, as a 50 uA current. The current iB may be implemented, in one example, as a 500 uA current. The current iC, may be implemented, in one example, as a 500 uA current. The current iD, may be implemented, in one example, as a 50 uA current. The inverters INV1 and INV2 may be implemented in parallel. The inverters INV1 and INV2 may have an asymmetrical charge/discharge current bias. The upper inverter INV1 may have less charge (or PMOS current). The inverter INV1 may be implemented to delay the falling edge of the signal CLK_IN while having very little effect on the rising edge. The lower inverter INV2 may have less discharge (or NMOS current). The inverter INV2 may delay the rising edge and while having little effect on the falling edge.

In one example, the slow falling edge of the signal CKOUT2B may be determined by the smaller NMOS sink current iD and/or the larger PMOS source current iC. The asymmetrical source/sink currents (e.g., the bias current iC and the bias current iD) may also result in a faster rising edge. Similarly, the slow rising edge and/or fast falling edge of the signal CKOUT1B may be determined by swapping the ratio of the source currents for the inverter INV1 (e.g., the larger NMOS source current iB and/or the smaller PMOS source current iA). The bias currents (e.g., iA, iB, iC and/or iD) may be selected to adjust the slope of the falling edge of the signal CKOUT2B and/or the slope of the rising edge of the signal CKOUT1B. Adjusting the slope of the falling edge of the signal CKOUT2B and/or the slope of the rising edge of the signal CKOUT1B may determine the threshold frequency $f_{th}$.

The bias currents (e.g., iA, iB, iC and/or iD) may determine the slower falling edge of the signal CKOUT2B and/or the slower rising edge of the signal CKOUT1B. The bias currents (e.g., iA, iB, iC and/or iD) may be chosen for a particular value of the threshold frequency $f_{th}$. Generally, the smaller bias current value (e.g., the bias current iA for the inverter INV1 and/or the bias current iD for the inverter INV2) may have a larger impact on the slope of the edges of the signal CKOUI1B and/or the signal CKOUT2B (e.g., selecting the threshold frequency $f_{th}$). In one example, a value of 50 uA for the bias current iA and a value of 400 uA for the bias current iB may produce a similar result for the signal CKOUT1B as a value of 50 uA for the bias current iA and a value of 600 uA for the bias current iB. In another example, a value of 40 uA for the bias current iA and a value of 400 uA for the bias current iB may produce a different result for the signal CKOUT1B than a value of 50 uA for the bias current iA and a value of 500 uA for the bias current iB.

The inverters INV3 and/or INV4 may be simple inverters with equal strength of PMOS and NMOS transistors. The outputs (e.g., CKOUT1 and CKOUT2) of the inverter INV3 may then be XOR-ed through the gate 180 to generate the intermediate signal OUT1. The signal OUT1 may have a constant waveform. The signal OUT1 may have negative pulses corresponding to the rising and falling edges of the input clock signal CLK_IN. The design of the circuit 130 may be configured to implement negative pulses with a width of approximately $0.5/f_{th}$. For example, the components Q1, Q2, Q3, Q4, Q5, Q6, Q7, Q8, C1 and/or C2 and/or the bias currents iA, iB, iC and/or iD may be designed (e.g., pre-determined) to generate the negative pulses based on the pre-determined threshold frequency $f_{th}$. For example, the threshold frequency $f_{th}$ may inform the components and/or bias currents selected for the design of the circuit 130.

Figure 4:
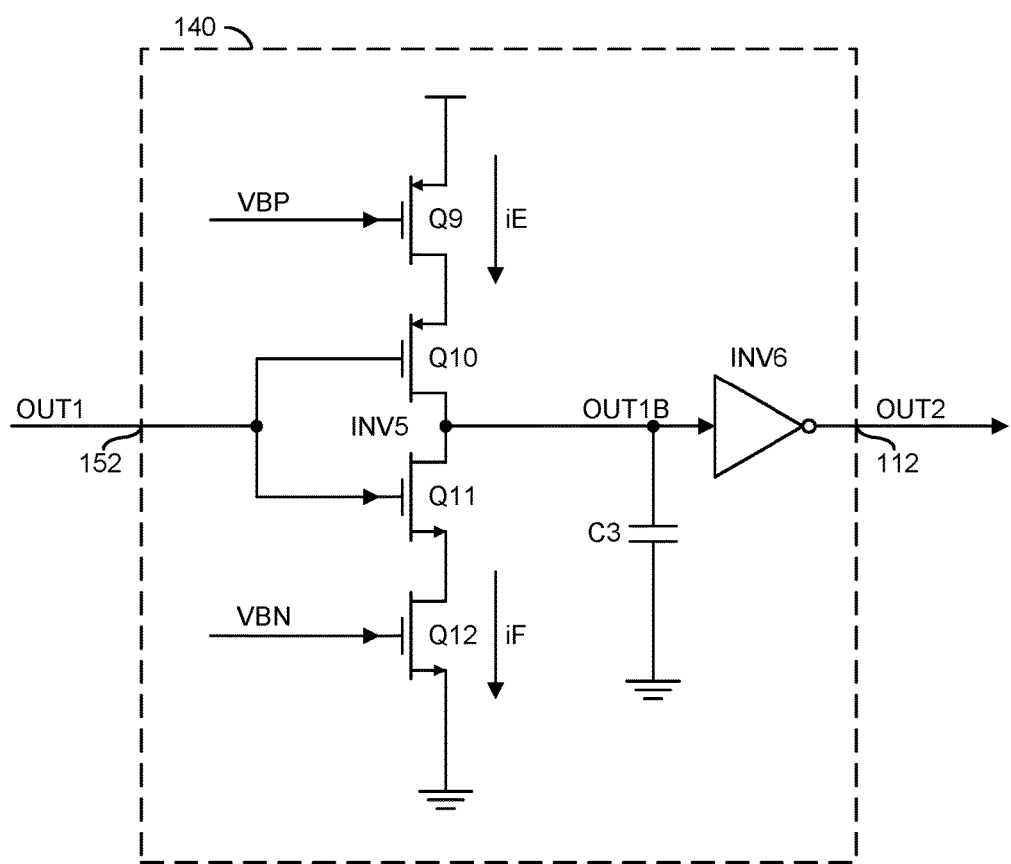
FIG. 4 is a circuit diagram of a pulse-shaping circuit.

Referring to FIG. 4, an example design of the pulse-shaping circuit stage 2 circuit 140 is shown. The circuit 140 generally comprises an inverter INV5 and an inverter INV6. In some embodiments, the circuit 140 may have an implementation similar to a portion of the circuit 130 (e.g., a combination of the inverter INV2 with less discharge (or NMOS current) and/or the inverter INV4). The inverter INV5 may be implemented with an asymmetrical charge/discharge current bias. The inverter INV6 may be implemented as a standard (e.g., conventional) inverter.

The inverter INV5 generally comprises a transistor Q9, a transistor Q10, a transistor Q11 and a transistor Q12. The transistor Q9 and the transistor Q10 may be implemented as PMOS transistors. The transistor Q11 and the transistor Q12 may be implemented as NMOS transistors. The particular type of transistor implemented may be varied according to the design criteria of a particular implementation. The transistor Q9 may receive a signal (e.g., VBP). The transistor Q12 may receive a signal (e.g., VBN). In some embodiments, the signal VBP may be the same signal and/or have the same value as the signal VBP1 and/or the signal VBP2 (described in association with FIG. 3). In some embodiments, the signal VBN may be the same signal and/or have the same value as the signal VBN1 and/or VBN2 (described in association with FIG. 3). The transistor Q10 and the transistor Q11 may receive the signal OUT1. The signal OUT1 may be received by the input 152 of the circuit 140.

The inverter INV5 generally implements a bias current iE and a bias current iF. The current iE, may be implemented, in one example, as a 500 uA current. The current iF, may be implemented, in one example, as a 50 uA current. The current iE and/or the current iF may be varied according to the design criteria of a particular implementation.

The inverter INV5 may generate a signal (e.g., OUT1B). The signal OUT1B may be implemented as a sub-signal. In one example, the signal OUT1B may be an inverted version of the intermediate signal OUT1 having a delayed edge (e.g., when the intermediate signal OUT1 has pulses). The delayed edge of the intermediate signal OUT1 may be converted to have a slope in the signal OUT1B. In another example, the signal OUT1B may be an inverted version of the intermediate signal OUT1 having a constant value (e.g., when the intermediate signal OUT1 is a constant value).

In one example, a slow edge of the signal OUT1B may be determined by the ratio of the NMOS sink current iF and/or the PMOS source current iE. The asymmetrical source/sink currents (e.g., the bias current iE and the bias current iF) may have a similar effect for the inverter INV5 as the bias currents (e.g., iA, iB, iC and/or iD) described in association with FIG. 3.

The inverter INV5 may generate the signal OUT1B in response to the intermediate signal OUT1. The signal OUT1B may be presented to an input of the inverter INV6. A capacitor (e.g., C3) may provide a filter to the input of the inverter INV6 (e.g., filter the signal OUT1B). The inverter INV6 may generate the signal OUT2 in response to the signal OUT1B. The signal OUT2 may be presented as the output 112 of the circuit 140.

The inverter INV6 may convert the slope of the signal OUT1B to an edge. The conversion of the slope (e.g., the midpoint or threshold of the slope where the inverter INV6 inverts a signal) of the signal OUT1B may result in a delay of the edge. Since the width of the negative pulse of the intermediate signal OUT1 may be approximately $0.5/f_{th}$, delaying the edge of the pulse may result in a constant value for the signal OUT2 when the intermediate signal OUT1 has pulses. The slope of the signal OUT1B may not cross the threshold of the inverter INV6. Since the slope does not cross the threshold of the inverter INV6, the signal OUT2 may have a constant (or steady state) value. In some embodiments, where the signal OUT1 is a constant (or steady state) value, the inverter INV5 and/or the inverter INV6 may invert the constant value, resulting in a constant value.

The circuit 140 may be configured to remove the negative pulses on the signal OUT1 (if any). In one example, a logic "high" may be produced on the signal OUT2 when there are negative pulses on the intermediate signal OUT1 (e.g., the case when $f_{in}<f_{th}$). A logic "low" may be produced on the signal OUT2 when the signal OUT1 is a constant "low" (e.g., the case $f_{in}>f_{th}$). For example, the components Q9, Q10, Q11, Q12 and/or C3 and/or the bias currents iE and/or iF may be designed (e.g., pre-determined) to generate the control signal OUT2 based on the shape of the waveform of the intermediate signal OUT1.

Figure 5:
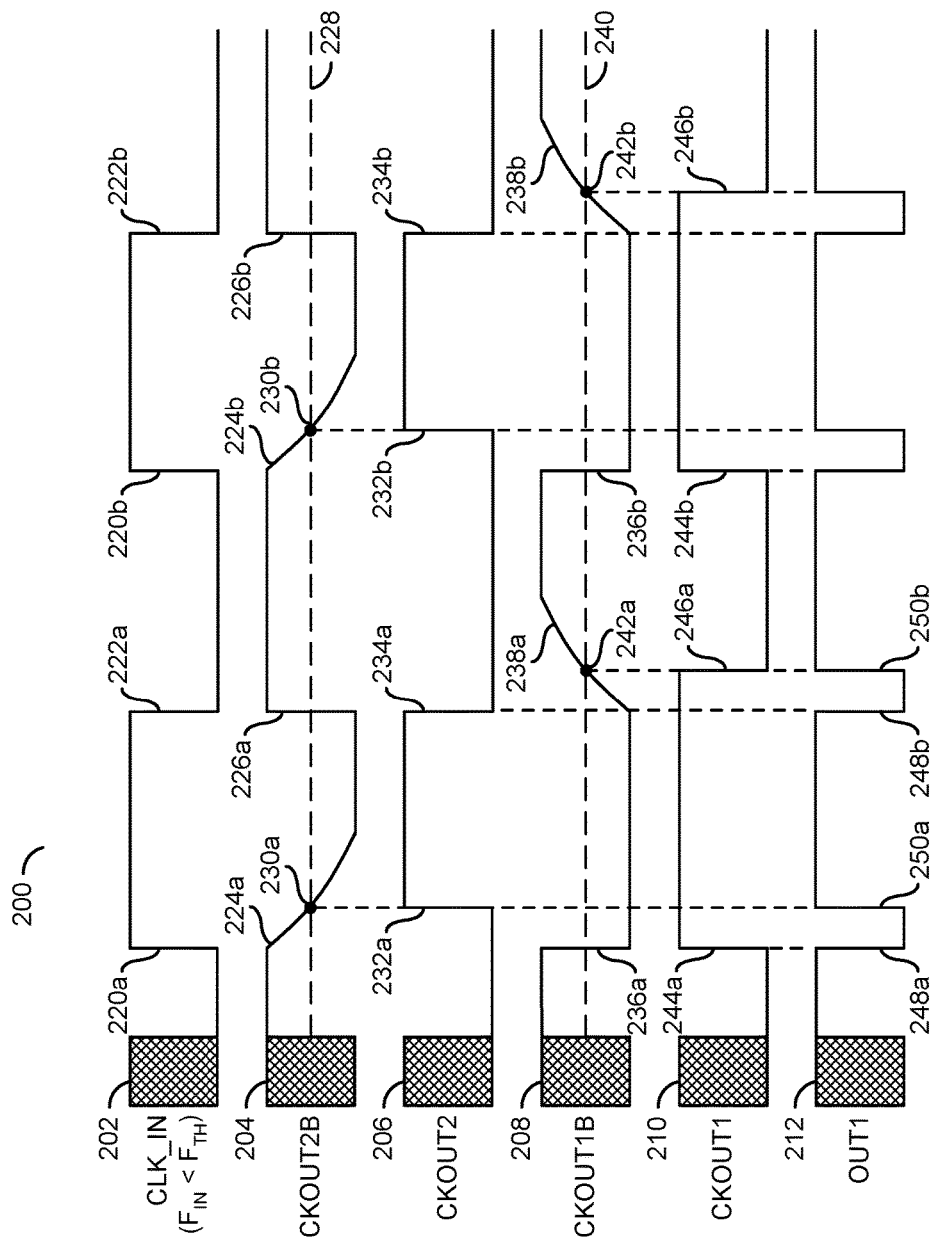
FIG. 5 is a timing diagram illustrating the stage 1 pulse-shaping.

Referring to FIG. 5, a diagram 200 illustrating the working principle of the pulse-shaping circuit 130 is shown. Example waveforms of the signals in the stage 1 pulse-shaping circuit 130 are shown when the frequency $f_{in}$ of the input clock signal CLK_IN is less than the threshold frequency $f_{th}$. A waveform 202 may represent an example of the signal CLK_IN (when $f_{in}<f_{th}$). A waveform 204 may represent an example of the signal CKOUT2B (when $f_{in}<f_{th}$). A waveform 206 may represent an example of the signal CKOUT2 (when $f_{in}<f_{th}$). A waveform 208 may represent an example of the signal CKOUT1B (when $f_{in}<f_{th}$). A waveform 210 may represent an example of the signal CKOUT1 (when $f_{in}<f_{th}$). A waveform 212 may represent an example of the signal OUT1 (when $f_{in}<f_{th}$). The various waveforms 202-212 are shown as representative examples. The shapes of the various waveforms 202-212 may be varied according to the design criteria of a particular implementation.

The CLK_IN waveform 202 may operate at the frequency $f_{in}$. The CLK_IN waveform 202 is shown having a square waveform. The CLK_IN waveform 202 may comprise rising edges 220a-220b, falling edges 222a-222b and/or additional rising and falling edges (not shown).

The CKOUT2B waveform 204 may represent the signal CLK_IN after passing through the inverter INV2. The CKOUT2B waveform 204 may be inverted compared to the CLK_IN waveform 202. The CKOUT2B waveform 204 may comprise falling slopes 224a-224b, rising edges 226a-226b and/or additional rising edges and falling slopes (not shown). The falling slopes 224a-224b are shown starting to fall (e.g., transition from logical "high" to logical "low") at approximately a time corresponding to the transition of the rising edges 220a-220b of the CLK_IN waveform 202. The rising edges 226a-226b are shown starting to transition (e.g., transition from logical "low" to logical "high") at approximately a time corresponding to the transition of the falling edges 222a-222b of the CLK_IN waveform 202.

A line 228 is shown. The line 228 may be a representation of the threshold of the inverter INV4. In an example, when the CKOUT2B waveform 204 is above the line 228, the inverter INV4 may invert the signal to a logical "low". In another example, when the CKOUT2B waveform 204 is below the line 228, the inverter INV4 may invert the signal to a logical "high". Threshold points 230a-230b are shown on the CKOUT2B waveform 204. The threshold points 230a-230b may represent a point where the inverter INV4 may perform a transition (e.g., from logical "low" to logical "high"). The threshold points 230a-230b of the CKOUT2B waveform 204 are shown at a time that is after the corresponding rising edges 220a-220b of the CLK_IN waveform 202.

The CKOUT2 waveform 206 may be generally inverted compared to the CKOUT2B waveform 204. The CKOUT2 waveform 206 may comprise rising edges 232a-232b, falling edges 234a-234b and/or additional rising and falling edges (not shown). The CKOUT2 waveform 206 may be a replica of the CLK_IN waveform 202 with delayed rising edges 232a-232b. For example, the CKOUT2 waveform 206 may have little change to the falling edges 234a-234b compared to the falling edges 222a-222b of the CLK_IN waveform 202.

The delayed rising edges 232a-232b in the CKOUT2 waveform 206 may correspond to the threshold points 230a-230b of the CKOUT2B waveform 204. In one example, the delayed rising edge 232a may transition in response to the falling slope 224a crossing the threshold point 230a. The CKOUT2 waveform 206 may be a logical "low" when the CKOUT2B waveform 204 has a value greater than the threshold line 228. Similarly, the CKOUT2 waveform 206 may be a logical "high" when the CKOUT2B waveform 204 has a value less than the threshold line 228. The falling edges 234a-234b of the CKOUT2 waveform 206 may correspond to the falling edges 222a-222b of the CLK_IN waveform 202 (and the rising edges 226a-226b of the CKOUT2B waveform 204).

The CKOUT2B waveform 204 may be generally inverted compared to the CLK_IN waveform 202 in response to the inverter INV2 (e.g., a first inversion of the CLK_IN waveform 202). The CKOUT2 waveform 204 may be generally inverted compared to the CKOUT2B waveform 204 and may generally correspond to the CLK_IN waveform 202 in response to the inverter INV4 (e.g., a second inversion of the CLK_IN waveform 202). The inverter INV2 and/or the inverter INV4 may modify the CLK_IN waveform 202 to generate the CKOUT2 waveform 206 having delayed rising edges 232a-232b.

The CKOUT1B waveform 208 may represent the signal CLK_IN after passing through the inverter INV1. The CKOUT1B waveform 208 may be inverted compared to the CLK_IN waveform 202. The CKOUT1B waveform 208 may comprise falling edges 236a-236b, rising slopes 238a-238b and/or additional falling edges and rising slopes (not shown). The rising slopes 238a-238b are shown starting to rise (e.g., transition from logical "low" to logical "high") at approximately a time corresponding to the transition of the falling edges 222a-222b of the CLK_IN waveform 202. The falling edges 236a-236b are shown starting to transition (e.g., transition from logical "high" to logical "low") at approximately a time corresponding to the transition of the rising edges 220a-220b of the CLK_IN waveform 202.

A line 240 is shown. The line 240 may be a representation of the threshold of the inverter INV3. In an example, when the CKOUT1B waveform 208 is above the line 240, the inverter INV3 may invert the signal to a logical "low". In another example, when the CKOUT1B waveform 208 is below the line 240, the inverter INV3 may invert the signal to a logical "high". Threshold points 242a-242b are shown on the CKOUT1B waveform 208. The threshold points 242a-242b may represent a point where the inverter INV3 may perform a transition (e.g., from logical "high" to logical "low"). The threshold points 242a-242b of the CKOUT1B waveform 208 are shown at a time that is after the corresponding falling edges 222a-222b of the CLK_IN waveform 202.

The CKOUT1 waveform 210 may be generally inverted compared to the CKOUT1B waveform 208. The CKOUT1 waveform 210 may comprise rising edges 244a-244b, falling edges 246a-246b and/or additional rising and falling edges (not shown). The CKOUT1 waveform 210 may be a replica of the CLK_IN waveform 202 with delayed falling edges 246a-246b. For example, the CKOUT1 waveform 210 may have little change to the rising edges 244a-244b compared to the rising edges 220a-220b of the CLK_IN waveform 202.

The delayed falling edges 246a-246b in the CKOUT1 waveform 210 may correspond to the threshold points 242a-242b of the CKOUT1B waveform 208. In one example, the delayed falling edge 246a may transition in response to the rising slope 238a crossing the threshold point 242a. The CKOUT1 waveform 210 may be a logical "low" when the CKOUT1B waveform 208 has a value greater than the threshold line 240. Similarly, the CKOUT1 waveform 210 may be a logical "high" when the CKOUT1B waveform 208 has a value less than the threshold line 240. The rising edges 244a-244b of the CKOUT1 waveform 210 may correspond to the rising edges 220a-220b of the CLK_IN waveform 202 (and the falling edges 236a-236b of the CKOUT1B waveform 208).

The CKOUT1B waveform 208 may be generally inverted compared to the CLK_IN waveform 202 in response to the inverter INV1 (e.g., a first inversion of the CLK_IN waveform 202). The CKOUT1 waveform 210 may be generally inverted compared to the CKOUT1B waveform 208 and may generally correspond to the CLK_IN waveform 202 in response to the inverter INV3 (e.g., a second inversion of the CLK_IN waveform 202). The inverter INV1 and/or the inverter INV3 may modify the CLK_IN waveform 202 to generate the CKOUT1 waveform 210 having delayed falling edges 246a-246b.

The OUT1 waveform 212 may be a representative example of an XOR-ed (and inverted) result of the CKOUT1 waveform 210 and the CKOUT2 waveform 206. In one example, the OUT1 waveform 212 may be a logical "high" value when the CKOUT2 waveform 206 and the CKOUT1 waveform 210 are both logical "low" or both logical "high".

In another example, the OUT1 waveform 212 may be a logical "low" value when the CKOUT2 waveform 206 is a logical "low" and the CKOUT1 waveform 210 is a logical "high". In yet another example, the OUT1 waveform 212 may be a logical "low" value when the CKOUT2 waveform 206 is a logical "high" and the CKOUT1 waveform 210 is a logical "low".

The OUT1 waveform 212 may have negative pulses. A first negative pulse is shown having a falling edge 248a and a rising edge 250a. A second negative pulse is shown having a falling edge 248b and a rising edge 250b. The OUT1 waveform 212 may have additional negative pulses.

The negative pulses of the OUT1 waveform 212 may correspond to each rising edge 220a-220b and falling edge 222a-222b of the CLK_IN waveform 202. In an example, the first negative pulse may start (e.g., the falling edge 248a) corresponding to the rising edge 220a of the CLK_IN waveform 202 and end (e.g., the rising edge 250a) corresponding to the threshold point 230a of the CKOUT2B waveform 204. In another example, the second negative pulse may start (e.g., the falling edge 248b) corresponding to the falling edge 222a of the CLK_IN waveform 202 and end (e.g., the rising edge 250b) corresponding to the threshold point 242a of the CKOUT1B waveform 208. The width of the negative pulses may be determined based on the components selected for the first pulse-shaping stage circuit 130 (e.g., Q1-Q8, VBP1-VBP2, VBN1-VBN2, C1-C2, INV3, INV4, the gate 180, etc.) and/or the selected bias currents (e.g., iA, iB, iC, iD, etc.). In some embodiments, the components of the first pulse-shaping stage circuit 130 may be selected to generate the negative pulses having a width of approximately $0.5/f_{th}$.

Figure 6:
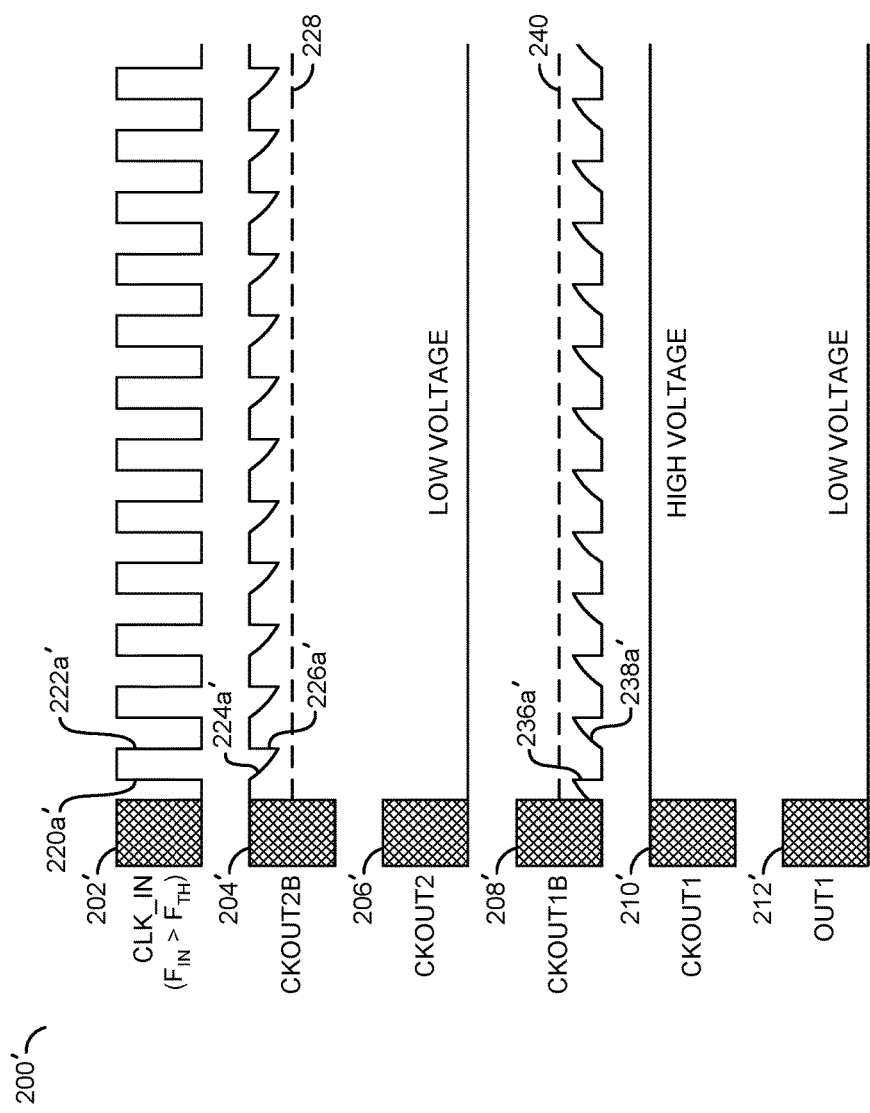
FIG. 6 is a timing diagram illustrating a condition where an input frequency is higher than a threshold frequency.

Referring to FIG. 6, a diagram 200' illustrating an alternate example of the working principle of the pulse-shaping circuit 130 is shown. Example waveforms of the signals in the stage 1 pulse-shaping circuit 130 are shown when the frequency $f_{in}$ of the input clock signal CLK_IN is greater than the threshold frequency $f_{th}$. A waveform 202' may represent an example of the signal CLK_IN (when $f_{in} > f_{th}$). A waveform 204' may represent an example of the signal CKOUT2B (when $f_{in} > f_{th}$). A waveform 206' may represent an example of the signal CKOUT2 (when $f_{in} > f_{th}$). A waveform 208' may represent an example of the signal CKOUT1B (when $f_{in} > f_{th}$). A waveform 210' may represent an example of the signal CKOUT1 (when $f_{in} > f_{th}$). A waveform 212' may represent an example of the signal OUT1 (when $f_{in}, > f_{th}$). The various waveforms 202'-212' are shown as representative examples. The shapes of the various waveforms 202'-212' may be varied according to the design criteria of a particular implementation.

The CLK_IN waveform 202' may be similar to the CLK_IN waveform 202. The CLK_IN waveform 202' may have a higher frequency than the CLK_IN waveform 202. The CKOUT2B waveform 204' may represent the signal CLK_IN after passing through the inverter INV2. Since the frequency $f_{in}$ is greater than the threshold frequency $f_{th}$, the falling slope 224a' of the CKOUT2B waveform 204' may not cross the threshold line 228. For example, the rising edge 226a' may occur before the threshold point is reached. Since the threshold line 228 is never crossed, the CKOUT2B waveform 204' may be above the line 228. The inverter INV4 may invert the CKOUT2B waveform 204' to a logical "low". The CKOUT2 waveform 206' is shown as a logical "low" voltage.

The CKOUT1B waveform 208' may represent the signal CLK_IN after passing through the inverter INV1. Since the frequency $f_{in}$ is greater than the threshold frequency $f_{th}$, the rising slope 236a' of the CKOUT1B waveform 208' may not cross the threshold line 240. For example, the falling edge 238a' may occur before the threshold point is reached. Since the threshold line 240 is never crossed, the CKOUT1B waveform 208' may be below the line 240. The inverter INV3 may invert the CKOUT1B waveform 208' to a logical "high". The CKOUT1 waveform 210' is shown as a logical "high" voltage.

The OUT1 waveform 212' is shown as a constant logical "low" voltage. When the CKOUT2 waveform 206' is a constant logical "low" voltage and the CKOUT1 waveform 210' is a constant logical "high" voltage, the gate 180 may perform the XOR operation (e.g., a logical "high" result). The gate 180 may further invert the waveform, resulting in the logical "low" voltage for the intermediate signal OUT1.

Figure 7:
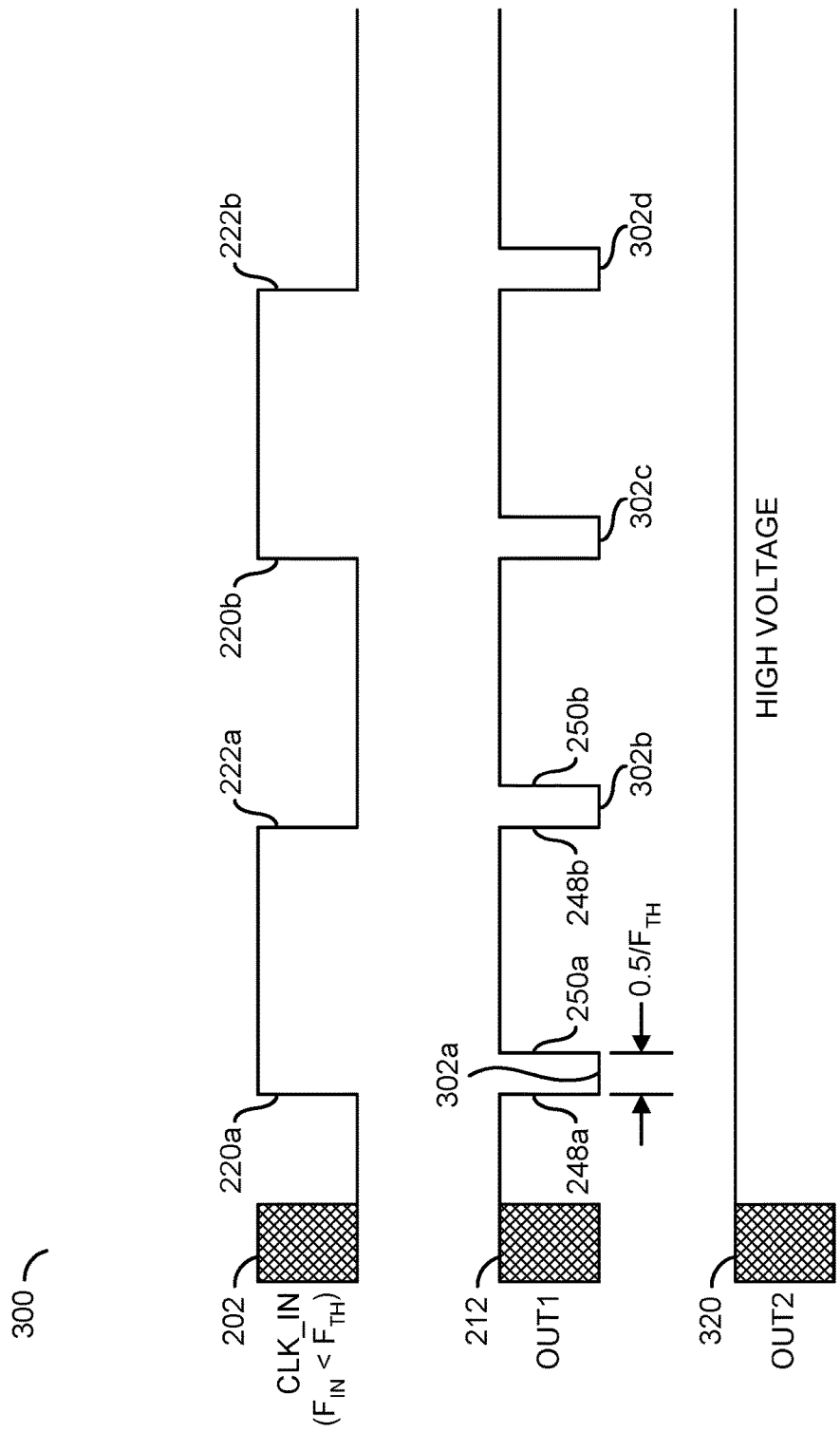
FIG. 7 is a timing diagram showing a case when the input frequency is less than the threshold frequency.

Referring to FIG. 7, a diagram 300 illustrating example waveforms of the working principle of the pulse-shaping circuit 140 is shown. Example waveforms of the signals in the stage 2 pulse-shaping circuit 140 (and the signal CLK_IN) are shown when the frequency $f_{in}$ of the input clock signal CLK_IN is less than the threshold frequency $f_{th}$. The waveform 202 may represent an example of the signal CLK_IN (when $f_{in} < f_{th}$). The waveform 212 may represent an example of the signal OUT1 (when $f_{in} < f_{th}$). A waveform 320 may represent an example of the signal OUT2 (when $f_{in} < f_{th}$). The various waveforms 202, 212 and/or 320 are shown as representative examples. The shapes of the various waveforms 202, 212 and/or 320 may be varied according to the design criteria of a particular implementation.

The CLK_IN waveform 202 may have the frequency $f_{in}$ less than the threshold frequency $f_{th}$ (e.g., as described in association with FIG. 5). The OUT1 waveform 212 is shown having negative pulses 302a-302d. The OUT1 waveform 212 may have additional negative pulses. The negative pulses 302a-302d of the OUT1 waveform 212 may correspond to each rising edge 220a-220b and falling edge 222a-222b of the CLK_IN waveform 202 (e.g., as described in association with FIG. 5). In the example shown, the width of the negative pulses 302a-302d may be approximately $0.5/f_{th}$.

The input 152 of the stage 2 pulse-shaping circuit 140 may receive the OUT1 waveform 212. The inverter INV5 may modify the OUT1 waveform 212 to generate the signal OUT1B. The inverter INV5 may invert the OUT1 waveform 212 and/or delay the falling edges 248a-248b (e.g., resulting in rising slopes in the inverted signal OUT1B). The signal OUT1B may have a waveform similar to the CKOUT1B waveform 208' (e.g., described in association with FIG. 6). Since the width of the negative pulses 302a-302d may be approximately $0.5/f_{th}$, the delayed rising slopes of the inverted signal OUT1B may not cross the threshold of the inverter INV6. For example, the signal OUT1B may remain below the threshold of the inverter INV6.

The inverter INV6 may invert the signal OUT1B. Since the signal OUT1B may remain below the threshold of the inverter INV6, the inverter INV6 may invert the signal to a logical "high" value. The inverter INV6 may generate the OUT2 waveform 320. The OUT2 waveform 320 may have a logical "high" voltage. The logical "high" voltage of the OUT2 waveform 320 may be generated by the stage 2 pulse-shaping circuit 140 in response to the negative pulses 302a-302d (and any other additional negative pulses) of the OUT1 waveform 212. For example, the logical "high" voltage of the OUT2 waveform 320 may indicate that the OUT1 waveform has the negative pulses 302a-302d (e.g., that the frequency $f_{in}$ of the signal CLK_IN is less than the threshold frequency $f_{th}$).

Figure 8:
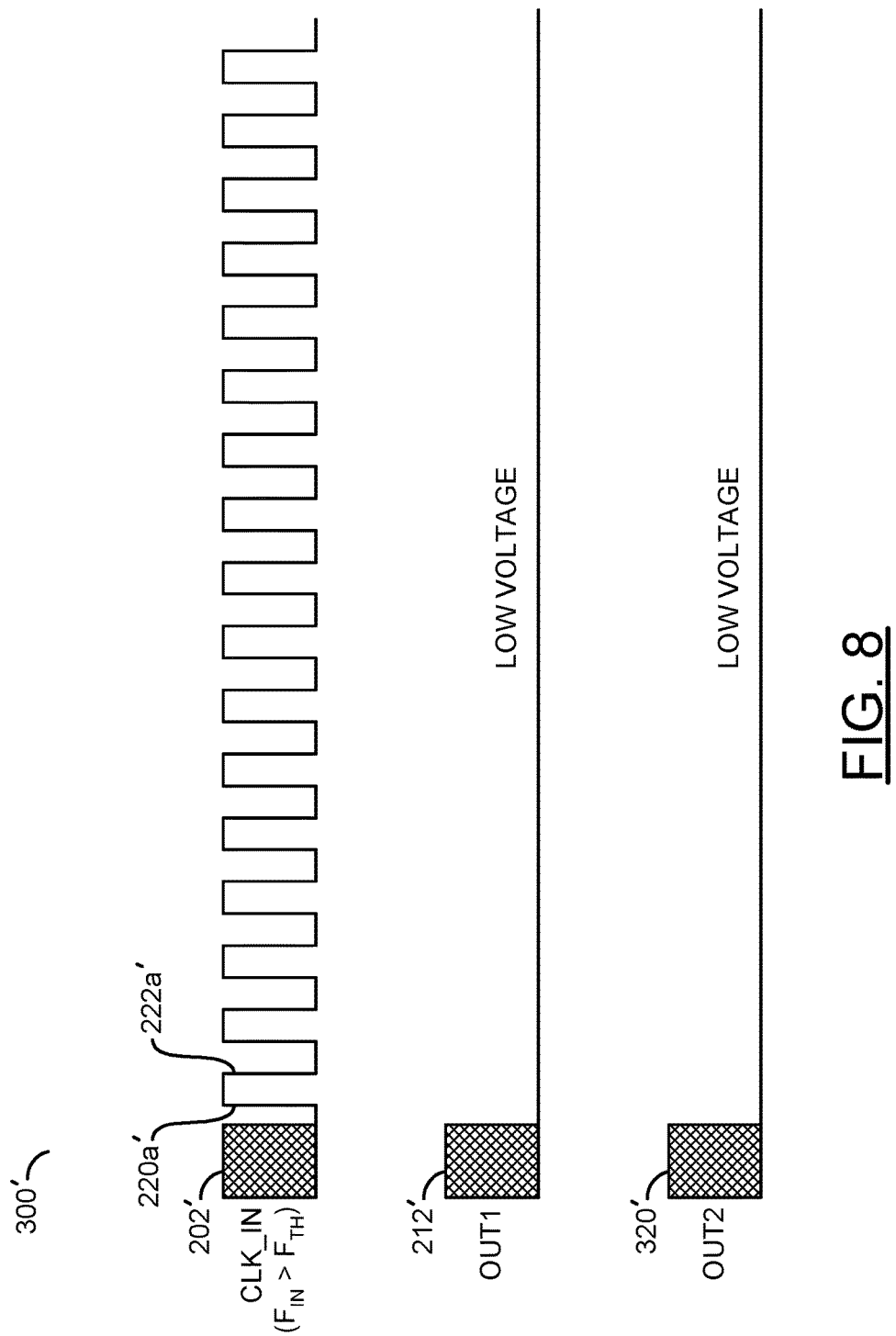
FIG. 8 is a timing diagram showing a case when the input frequency is greater than the threshold frequency.

Referring to FIG. 8, a diagram 300' illustrating example waveforms of the working principle of the pulse-shaping circuit 140 is shown. Example waveforms of the signals in the stage 2 pulse-shaping circuit 140 (and the signal CLK_IN) are shown when the frequency $f_{in}$ of the input clock signal CLK_IN is greater than the threshold frequency $f_{th}$. The waveform 202' may represent an example of the signal CLK_IN (when $f_{in} > f_{th}$). The waveform 212' may represent an example of the signal OUT1 (when $f_{in} > f_{th}$). A waveform 320' may represent an example of the signal OUT2 (when $f_{in} > f_{th}$). The various waveforms 202', 212' and/or 320' are shown as representative examples. The shapes of the various waveforms 202', 212' and/or 320' may be varied according to the design criteria of a particular implementation.

The CLK_IN waveform 202' may have the frequency $f_{in}$ greater than the threshold frequency $f_{th}$ (e.g., as described in association with FIG. 6). The OUT1 waveform 212' is shown having a constant logical "low" voltage (e.g., as described in association with FIG. 6). The input 152 of the stage 2 pulse-shaping circuit 140 may receive the OUT1 waveform 212'. The inverter INV5 may modify the OUT1 waveform 212' to generate the signal OUT1B. The inverter INV5 may invert the OUT1 waveform 212'. The signal OUT1B may have a waveform similar to the CKOUT1 waveform 210' (e.g., described in association with FIG. 6). For example, the signal OUT1B may be a constant logical "high" voltage.

The inverter INV6 may invert the signal OUT1B. The inverter INV6 may invert the signal to a logical "low" value. The inverter INV6 may generate the OUT2 waveform 320'. The OUT2 waveform 320' may have a logical "low" voltage. The logical "low" voltage of the OUT2 waveform 320' may be generated by the stage 2 pulse-shaping circuit 140 in response to the logical "low" voltage of the OUT1 waveform 212'. For example, the logical "low" voltage of the OUT2 waveform 320' may indicate that the OUT1 waveform 212' does not have negative pulses (e.g., that the frequency $f_{in}$ of the signal CLK_IN is greater than the threshold frequency $f_{th}$).

Figure 9:
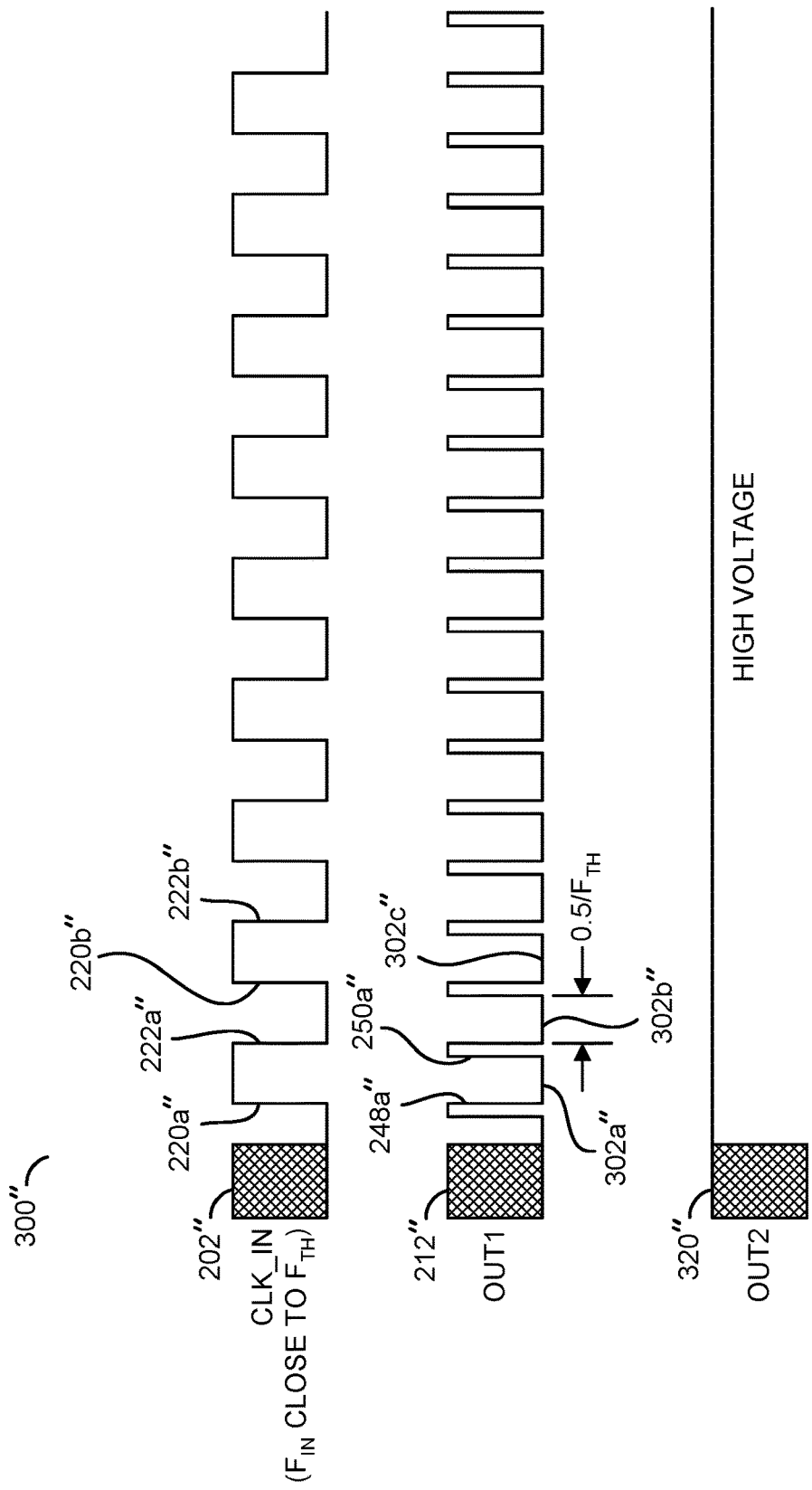
FIG. 9 is a timing diagram showing a case when the input frequency is close to but still less than the reference frequency.

Referring to FIG. 9, a diagram 300" illustrating example waveforms of the working principle of the pulse-shaping circuit 140 is shown. Example waveforms of the signals in the stage 2 pulse-shaping circuit 140 (and the signal CLK_IN) are shown when the frequency $f_{in}$ of the input clock signal CLK_IN is close to the threshold frequency $f_{th}$. For example, the frequency $f_{th}$ of the input clock signal CLK_IN may be close to the threshold frequency $f_{th}$, but still less than the threshold frequency $f_{th}$. A waveform 202" may represent an example of the signal CLK_IN (when $f_{in}$ is close to $f_{th}$ and $f_{in} < f_{th}$). A waveform 212" may represent an example of the signal OUT1 (when $f_{in}$ is close to $f_{th}$ and $f_{th} < f_{th}$). A waveform 320" may represent an example of the signal OUT2 (when $f_{in}$ is close to $f_{th}$ and $f_{in} < f_{th}$). The various waveforms 202", 212" and/or 320" are shown as representative examples. The shapes of the various waveforms 202", 212" and/or 320" may be varied according to the design criteria of a particular implementation.

The OUT1 waveform 212" is shown having negative pulses 302a"-302c". The OUT1 waveform 212" may have additional negative pulses. The negative pulses 302a"-302c" of the OUT1 waveform 212" may correspond to each rising edge 220a"-220b" and falling edge 222a"-222b" of the CLK_IN waveform 202". In the example shown, the width of the negative pulses 302a"-302c" may be approximately $0.5/f_{th}$.

The input 152 of the stage 2 pulse-shaping circuit 140 may receive the OUT1 waveform 212". The inverter INV5 may modify the OUT1 waveform 212" to generate the signal OUT1B. The inverter INV5 may invert the OUT1 waveform 212" and/or delay the falling edges 248a"-248b" (e.g., resulting in rising slopes in the inverted signal OUT1B). The signal OUT1B may have a waveform similar to the CKOUT1B waveform 208' (e.g., described in association with FIG. 6). Since the width of the negative pulses 302a"-302c" may be approximately $0.5/f_{th}$, the delayed rising slopes of the inverted signal OUT1B may not cross the threshold of the inverter INV6. For example, the signal OUT1B may remain below the threshold of the inverter INV6.

The inverter INV6 may invert the signal OUT1B. Since the signal OUT1B may remain below the threshold of the inverter INV6, the inverter INV6 may invert the signal to a logical "high" value. The inverter INV6 may generate the OUT2 waveform 320". The OUT2 waveform 320" may have a logical "high" voltage. The logical "high" voltage of the OUT2 waveform 320" may be generated by the stage 2 pulse-shaping circuit 140 in response to the negative pulses 302a"-302c" (and any other additional negative pulses) of the OUT1 waveform 212". For example, the logical "high" voltage of the OUT2 waveform 320" may indicate that the OUT1 waveform has the negative pulses 302a"-302c" (e.g., that the frequency $f_{in}$ of the signal CLK_IN is less than the threshold frequency $f_{th}$), even when the frequency $f_{in}$ of the signal CLK_IN is close to the threshold frequency $f_{th}$.

Figure 10:
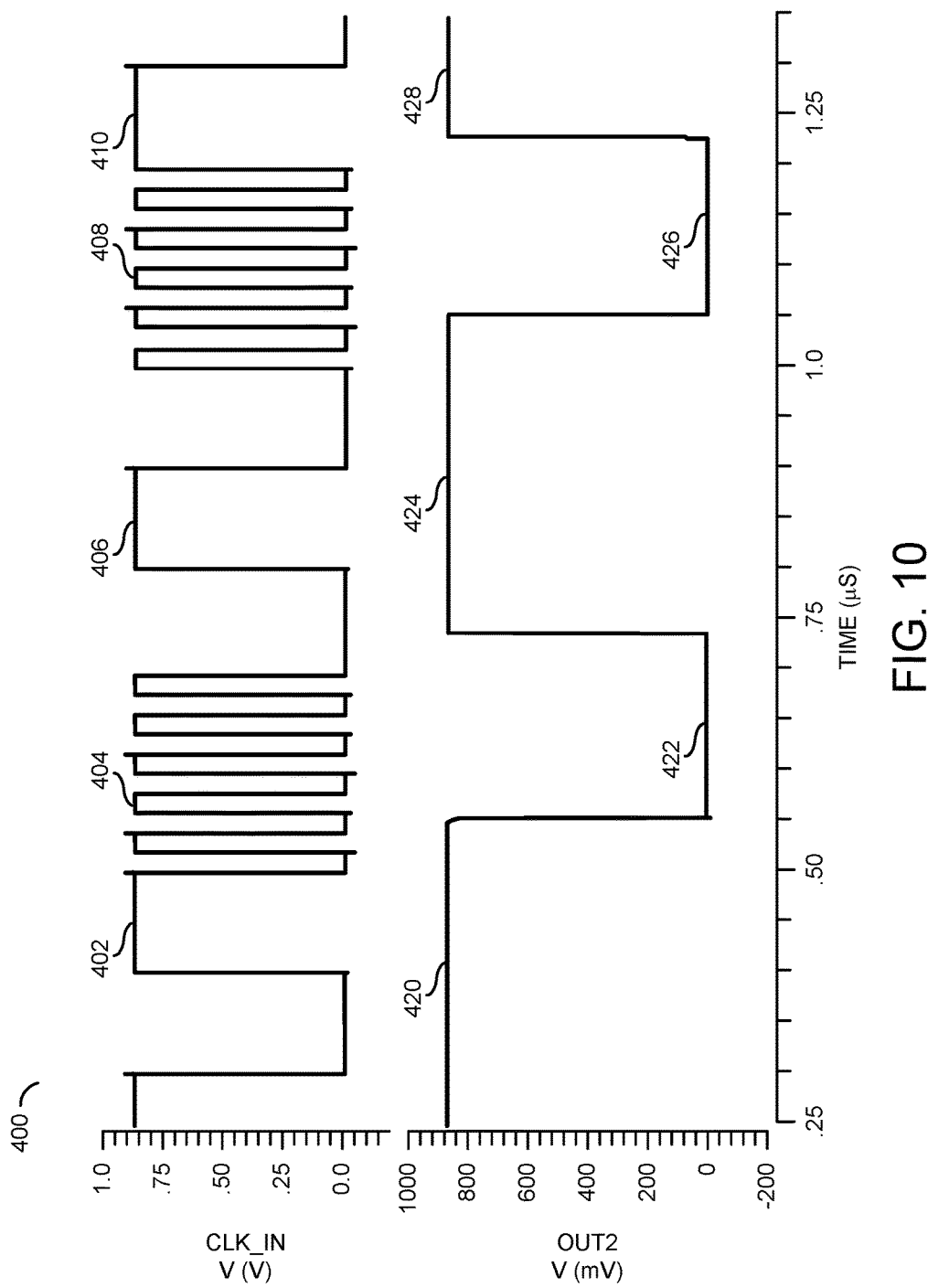
FIG. 10 is a timing diagram of a simulation of an example embodiment.

Referring to FIG. 10, a diagram 400 illustrating simulation results when the frequency $f_{in}$ of the input clock signal CLK_IN switches between frequencies higher than $f_{th}$ and lower than $f_{th}$ are shown. A simulated waveform of the voltage (measured in V) of the signal CLK_IN comprising a section 402, a section 404, a section 406, a section 408 and/or a section 410 is shown. A simulated waveform of the voltage (measured in mV) of the signal OUT2 comprising a section 420, a section 422, a section 424, a section 426 and/or a section 428 is shown. The simulated waveform of the signal OUT2 may represent the output control signal of the frequency detector 100. The frequency detector 100 may have a very fast response compared to the frequency change of the frequency $f_{in}$ of the input clock signal CLK_IN. For example, the response of the signal OUT2 may be updated within a few cycles (e.g., one or two cycles) of the input clock signal CLK_IN.

In the example shown, the section 402 of the simulated waveform CLK_IN may have the frequency $f_{in}$ less than the threshold frequency $f_{th}$. The section 402 may start at approximately 0.25 us and end at approximately 0.50 us. In the example shown, the section 404 of the simulated waveform CLK_IN may have the frequency $f_{in}$ greater than the threshold frequency $f_{th}$. The section 404 may start at approximately 0.50 us and end at approximately 0.70 us. For example, the frequency $f_{in}$ may change from less than $f_{th}$ to greater than $f_{th}$ at approximately 0.50 us.

In the example shown, the section 406 of the simulated waveform CLK_IN may have the frequency $f_{in}$ less than the threshold frequency $f_{th}$. The section 406 may start at approximately 0.70 us and end at approximately 1.0 us. For example, the frequency $f_{in}$ may change from greater than $f_{th}$ to less than $f_{th}$ at approximately 0.70 us.

In the example shown, the section 408 of the simulated waveform CLK_IN may have the frequency $f_{in}$ greater than the threshold frequency $f_{th}$. The section 408 may start at approximately 1.0 us and end at approximately 1.20 us. For example, the frequency $f_{in}$ may change from less than $f_{th}$ to greater than $f_{th}$ at approximately 1.0 us.

In the example shown, the section 410 of the simulated waveform CLK_IN may have the frequency $f_{in}$ less than the threshold frequency $f_{th}$. The section 410 may start at approximately 1.20 us. For example, the frequency $f_{in}$ may change from greater than $f_{th}$ to less than $f_{th}$ at approximately 1.20 us.

In the example shown, the section 420 of the simulated waveform OUT2 may have a logical "high" value from approximately 0.25 us until approximately 0.55 us. In the example shown, the section 422 of the simulated waveform OUT2 may have a logical "low" value from 0.55 us until approximately 0.75 us. For example, the transition of the simulated waveform OUT2 from logical "high" to logical "low" may occur at approximately 0.55 us. Since the frequency $f_{in}$ changed from less than $f_{th}$ to greater than $f_{th}$ at approximately 0.50 us, the response by the circuit 100 to the change of frequency may be approximately 0.05 us. At the frequency $f_{in}$ greater than the threshold frequency $f_{th}$, the response of the circuit 100 may be within approximately 2 cycles of the signal CLK_IN.

In the example shown, the section 424 of the simulated waveform OUT2 may have a logical "high" value from approximately 0.75 us until approximately 1.05 us. For example, the transition of the simulated waveform OUT2 from the logical "low" section 422 to the logical "high" section 424 may occur at approximately 0.75 us. Since the frequency $f_{in}$ changed from greater than $f_{th}$ to less than $f_{th}$ at approximately 0.70 us, the response by the circuit 100 to the change of frequency may be approximately 0.05 us. At the frequency $f_{in}$ less than the threshold frequency $f_{th}$, the response of the circuit 100 may be within approximately 1 cycle of the signal CLK_IN.

In the example shown, the section 426 of the simulated waveform OUT2 may have a logical "low" value from approximately 1.05 us until approximately 1.25 us. For example, the transition of the simulated waveform OUT2 from the logical "high" section 424 to the logical "low" section 426 may occur at approximately 1.05 us. Since the frequency $f_{in}$ changed from less than $f_{th}$ to greater than $f_{th}$ at approximately 1.0 us, the response by the circuit 100 to the change of frequency may be approximately 0.05 us. At the frequency $f_{in}$ greater than the threshold frequency $f_{th}$, the response of the circuit 100 may be within approximately 2 cycles of the signal CLK_IN.

In the example shown, the section 428 of the simulated waveform OUT2 may have a logical "high" value from approximately 1.25 us. For example, the transition of the simulated waveform OUT2 from the logical "low" section 426 to the logical "high" section 428 may occur at approximately 1.25 us. Since the frequency $f_{in}$ changed from greater than $f_{th}$ to less than $f_{th}$ at approximately 1.20 us, the response by the circuit 100 to the change of frequency may be approximately 0.05 us. At the frequency $f_{in}$ less than the threshold frequency $f_{th}$, the response of the circuit 100 may be within approximately 1 cycle of the signal CLK_IN.

Another implementation of the pulse-shaping circuit 130 and/or the pulse-shaping circuit 140 in the circuit 100 may use different strength and/or size of the PMOS/NMOS transistors for the inverter INV1, INV2, INV3, INV4, INV5 and/or INV6, instead of different bias current. For example, selecting different strengths and/or sizes of the PMOS/NMOS transistors and/or selecting different bias currents may be used to select the pre-determined threshold frequency $f_{th}$.

The fast-response reference-less frequency detector 100 may be critical to many applications. In one example, the frequency detector 100 may be configured to enable implementation of a DDR4 register clock driver (RCD), which requires a fast detection to determine whether the input clock is above or below a pre-defined threshold frequency. The circuit 100 may provide a new solution for fast detection of an input clock as compared to a known frequency when there is no external reference clock signal.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to embodiments thereof, it will be understood by those skilled in the art that various changes in form and details may be made without departing from the scope of the invention.

The invention claimed is:

1. An apparatus comprising:
    a first circuit configured to generate an intermediate signal in response to an input clock signal operating at a frequency, wherein (i) said first circuit modifies said input clock signal according to a threshold frequency to generate a waveform for said intermediate signal and (ii) said waveform of said intermediate signal has at least one of (a) pulses and (b) a steady state; and
    a second circuit configured to generate a control signal in response to said intermediate signal, wherein (i) said second circuit modifies said intermediate signal to generate said control signal, (ii) said control signal has (a) a first state when said intermediate signal has said pulses and (b) a second state when said intermediate signal has said steady state and (iii) a width of said pulses is based on said threshold frequency.

2. The apparatus according to claim 1, wherein (i) said first circuit comprises a first pulse-shaping stage and (ii) said second circuit comprises a second pulse-shaping stage.

3. The apparatus according to claim 1, wherein said pulses relate to said frequency of said input clock signal.

4. The apparatus according to claim 1, wherein said first circuit comprises:
a first asymmetrical inverter configured to generate a first sub-signal in response to said input clock signal; and
a second asymmetrical inverter configured to generate a second sub-signal in response to said input clock signal, wherein said first sub-signal and said second sub-signal are combined to generate said intermediate signal.

5. The apparatus according to claim 4, wherein said first sub-signal and said second sub-signal are combined using a logic gate.

6. The apparatus according to claim 5, wherein said logic gate comprises an exclusive OR gate.

7. The apparatus according to claim 1, wherein said second circuit comprises:
an asymmetrical inverter configured to generate a sub-signal in response to said input clock signal; and
a conventional inverter configured to generate said control signal in response to said sub-signal.

8. The apparatus according to claim 1, wherein said waveform of said intermediate signal has pulses when said frequency of said input clock signal is less than said threshold frequency.

9. The apparatus according to claim 1, wherein said waveform of said intermediate signal has said steady state when said frequency of said input clock signal is greater than said threshold frequency.

10. The apparatus according to claim 1, wherein said width of said pulses is approximately 0.5 divided by said threshold frequency.

11. The apparatus according to claim 1, wherein said pulses correspond to a rising edge and a falling edge of said input clock signal.

12. The apparatus according to claim 1, wherein said pulses comprise negative pulses.

13. The apparatus according to claim 1, wherein said first state of said control signal is a logical high value.

14. The apparatus according to claim 1, wherein said second state of said control signal is a logical low value.

15. The apparatus according to claim 1, wherein said first circuit and said second circuit are implemented in series.

16. An apparatus comprising:
a first circuit configured to generate an intermediate signal in response to an input clock signal operating at a frequency, wherein (i) said first circuit modifies said input clock signal according to a threshold frequency to generate a waveform for said intermediate signal and (ii) said waveform of said intermediate signal has at least one of (a) pulses and (b) a steady state; and
a second circuit configured to generate a control signal in response to said intermediate signal, wherein (i) said second circuit modifies said intermediate signal to generate said control signal, (ii) said control signal has (a) a first state when said intermediate signal has said pulses and (b) a second state when said intermediate signal has said steady state, and (iii) said threshold frequency is a pre-determined value.

17. The apparatus according to claim 16, wherein said threshold frequency is pre-determined based on bias currents selected for a design of said first circuit.

18. The apparatus according to claim 16, wherein said threshold frequency is pre-determined based on components selected to design said first circuit.

19. An apparatus comprising:
a first circuit configured to generate an intermediate signal in response to an input clock signal operating at a frequency, wherein (i) said first circuit modifies said input clock signal according to a threshold frequency to generate a waveform for said intermediate signal and (ii) said waveform of said intermediate signal has at least one of (a) pulses and (b) a steady state; and
a second circuit configured to generate a control signal in response to said intermediate signal, wherein (i) said second circuit modifies said intermediate signal to generate said control signal, (ii) said control signal has (a) a first state when said intermediate signal has said pulses and (b) a second state when said intermediate signal has said steady state, and (iii) said control signal represents a comparison of said frequency of said input clock signal and said threshold frequency.

* * * * *